(12) United States Patent
Yi et al.

(10) Patent No.: US 12,527,036 B2
(45) Date of Patent: *Jan. 13, 2026

(54) SEMICONDUCTOR MEMORY DEVICE AND FABRICATION METHOD THEREOF

(71) Applicant: UNITED MICROELECTRONICS CORP., Hsin-Chu (TW)

(72) Inventors: Liang Yi, Singapore (SG); Chi Ren, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/739,341

(22) Filed: Jun. 11, 2024

(65) Prior Publication Data

US 2024/0332384 A1    Oct. 3, 2024

Related U.S. Application Data

(63) Continuation of application No. 17/835,965, filed on Jun. 9, 2022, now Pat. No. 12,040,369.

(51) Int. Cl.
*H10D 30/68* (2025.01)
*H10D 30/01* (2025.01)
*H10D 64/01* (2025.01)

(52) U.S. Cl.
CPC ..... *H10D 30/6892* (2025.01); *H10D 30/0411* (2025.01); *H10D 30/683* (2025.01); *H10D 64/035* (2025.01)

(58) Field of Classification Search
None
See application file for complete search history.

(56) References Cited

U.S. PATENT DOCUMENTS

| | | | |
|---|---|---|---|
| 9,159,735 B2 | 10/2015 | Tsair | |
| 12,040,369 B2* | 7/2024 | Yi | H10D 64/035 |
| 2015/0021679 A1* | 1/2015 | Tsair | H10B 41/00 438/266 |
| 2018/0233509 A1* | 8/2018 | Cai | G11C 16/0425 |
| 2018/0315765 A1* | 11/2018 | Lin | H10B 41/49 |
| 2019/0140063 A1* | 5/2019 | Liu | H10D 30/6891 |
| 2021/0013220 A1 | 1/2021 | Lin | |
| 2021/0036118 A1* | 2/2021 | Lin | H10D 64/035 |

* cited by examiner

*Primary Examiner* — Xiaoming Liu
(74) *Attorney, Agent, or Firm* — Winston Hsu

(57) ABSTRACT

A semiconductor memory device includes a substrate, an active region defined in the substrate by a trench isolation structure, a pair of floating gates on the substrate and at two sides of a fish-bone shaped recessed region of the active region, a source line doped region in the fish-bone shaped recessed region of the active region, wherein a bottom surface of the source line doped region extends above a bottom surface of the trench isolation structure, an erase gate disposed between the floating gates and on the source line doped region, a word line disposed on the substrate and adjacent to a side of each of the floating gates opposite to the erase gate, and a bit line doped region in the substrate and adjacent to the word line.

13 Claims, 10 Drawing Sheets

SEMICONDUCTOR MEMORY DEVICE AND FABRICATION METHOD THEREOF

CROSS REFERENCE TO RELATED APPLICATIONS

This application is a continuation application of U.S. application Ser. No. 17/835,965, filed on Jun. 9, 2022. The content of the application is incorporated herein by reference.

BACKGROUND OF THE INVENTION

1. Field of the Invention

The present invention relates to the field of semiconductor technology, and particularly relates to a semiconductor memory device and a manufacturing method thereof.

2. Description of the Prior Art

With the rapid development of the semiconductor technology, microcontroller units (MCUs), application specific integrated circuit (ASIC) and system-on-chip (SoC) chips are widely used in various electronic devices such as automotive electronics, industrial controllers and medical equipment. In pursuit of higher processing speed and lower power consumption, it has become the mainstream design trench to integrate embedded flash memory and logic circuit elements on the same chip.

Typically, an embedded flash memory comprises a memory array, which includes a large number of memory cells. Each of the memory cells includes a floating gate field-effect transistor capable of holding a charge. The cells are usually grouped into blocks. Each of the cells within a block can be electrically programmed in a random basis by charging the floating gate. The data in a cell is determined by the presence or absence of the charge in the floating gate. The charge can be removed from the floating gate by a block erase operation.

One issue with conventional embedded flash memory devices is source line bias error, which is particularly acute for memory architectures where a large number memory cells have their sources tied together in a source line to ground. Parallel sensing of these memory cells can result in a substantial current through the source line. Due to a finite resistance of the source line, an appreciable voltage drop may occur, affecting the accuracy of a sensing operation.

SUMMARY OF THE INVENTION

It is one object of the present invention to provide a novel semiconductor memory device and a manufacturing method thereof to solve the above-mentioned shortcomings or deficiencies of the prior art.

One aspect of the invention provides a semiconductor memory device including a substrate, an active region defined in the substrate by a trench isolation structure, a pair of floating gates on the substrate and at two sides of a fish-bone shaped recessed region of the active region, a source line doped region in the fish-bone shaped recessed region of the active region, wherein a bottom surface of the source line doped region extends above a bottom surface of the trench isolation structure, an erase gate disposed between the floating gates and on the source line doped region, a word line disposed on the substrate and adjacent to a side of each of the floating gates opposite to the erase gate, and a bit line doped region in the substrate and adjacent to the word line.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 10 are schematic diagrams illustrating a method of forming a semiconductor memory device according to an embodiment of the present invention, wherein:

FIG. 1 illustrates a partial plan view of the semiconductor memory device at a step of forming a pair of floating gates on a substrate;

FIG. 2 illustrates cross-sectional views of the semiconductor memory device at the step shown in FIG. 1 along line AA' and line BB';

FIG. 3 illustrates a partial plan view of the semiconductor memory device at a step of forming a recessed region between the floating gates;

FIG. 4 illustrates cross-sectional views of the semiconductor memory device at the step shown in FIG. 3 along line AA' and line BB';

FIG. 5 illustrates cross-sectional views of the semiconductor memory device along line AA' and line BB' at a step of forming a source line doped region in the substrate;

FIG. 6 illustrates cross-sectional views of the semiconductor memory device along line AA' and line BB' in FIG. 3 at a step of forming an insulating layer on the recessed region;

FIG. 7 illustrates a partial plan view of the semiconductor memory device after forming erase gate, word lines, bit line doped regions, and other components of the semiconductor memory device;

FIG. 8, FIG. 9 and FIG. 10 are cross-sectional views of the semiconductor memory device at the step shown in FIG. 7 along line AA', line BB' and line CC'.

DETAILED DESCRIPTION

Figure 1:
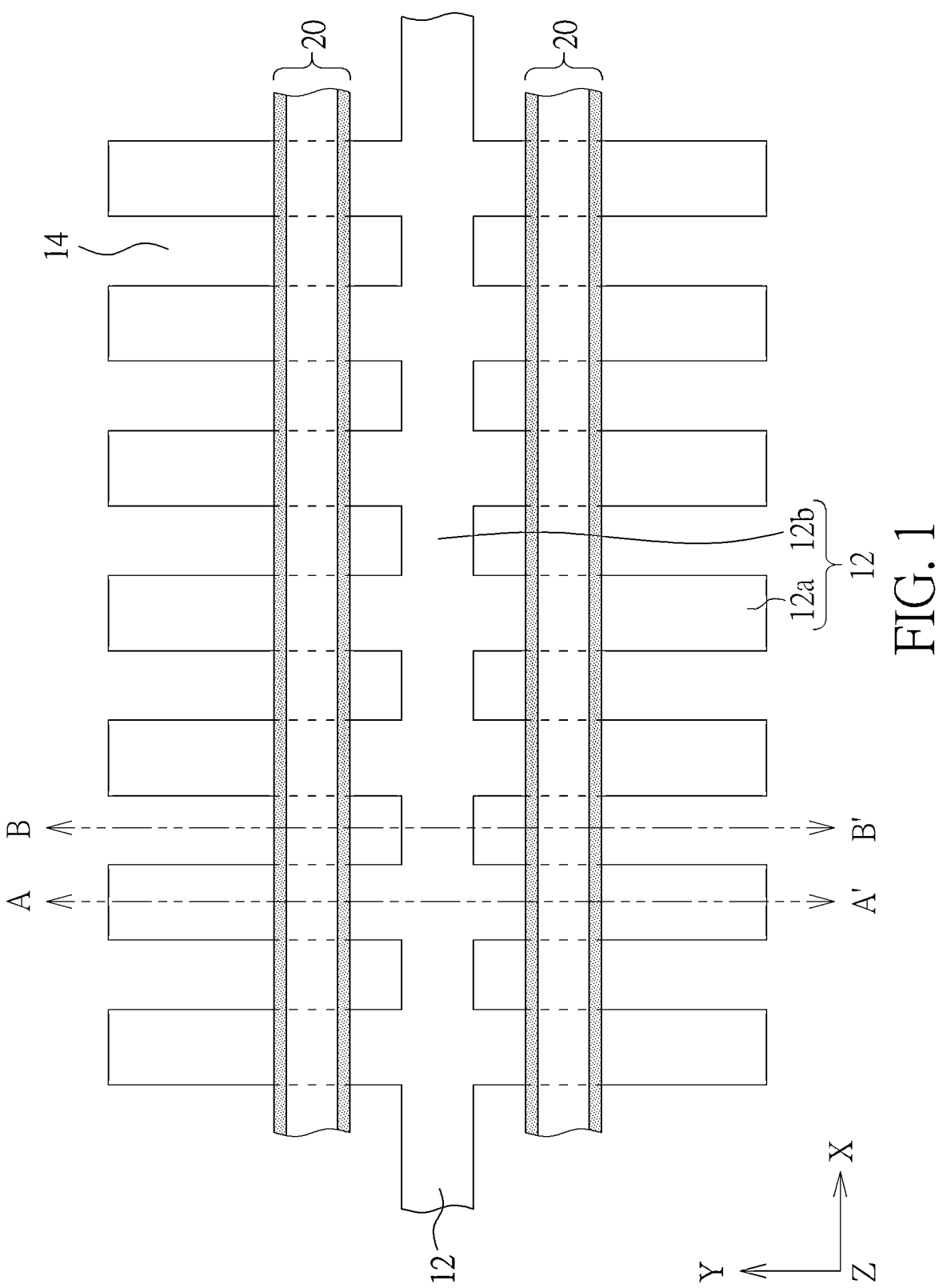

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. Relative dimensions and proportions of parts of the drawings have been shown exaggerated or reduced in size, for the sake of clarity and convenience in the drawings. The same reference signs are generally used to refer to corresponding or similar features in modified and different embodiments. These embodiments are described in sufficient detail to enable those skilled in the art to practice the invention. Other embodiments may be utilized and that structural, logical and electrical changes may be made without departing from the spirit and scope of the present invention.

FIG. 1 to FIG. 10 are schematic diagrams illustrating a method of forming a semiconductor memory device according to an embodiment of the present invention. Spatial reference directions such as X direction, Y direction and Z direction are shown in the drawings for the convenience of illustrating the structure of the semiconductor memory device. The X and Y directions are perpendicular to each other, and are parallel with the surface of the substrate used to fabricate the semiconductor memory device. The Z direction is vertical to the surface of the substrate. Please refer to FIG. 1 and FIG. 2, a substrate 10 having a surface 10a is provided. The substrate 10 may be a P-type doped silicon substrate, but is not limited thereto. A trench isolation structure 14 is formed in the substrate 10 to define an active region 12 in the substrate 10. The trench isolation structure 14 may include a dielectric material, such as such as silicon oxide (SiO$_2$), silicon nitride (SiN), or a combination thereof, but is not limited thereto. The top surface of the trench isolation structure 14 may protrude from the surface 10a of the substrate 10. As shown in FIG. 1, the active region 12 has a fish-bone shape, including a plurality of first portions 12a extending along the Y direction and arranged in parallel along the X direction, and a plurality of second portions 12b arranged alternately with the first portions 12a along the X direction and connect between the first portions 12a. Following, a dielectric layer 16 such as an oxide layer is formed on the substrate 10, and two stack structures 20 are formed on the substrate 10, and respectively extend along the X direction to cross the first portions 12a at opposite sides of the row of second portions 12b.

Figure 2:
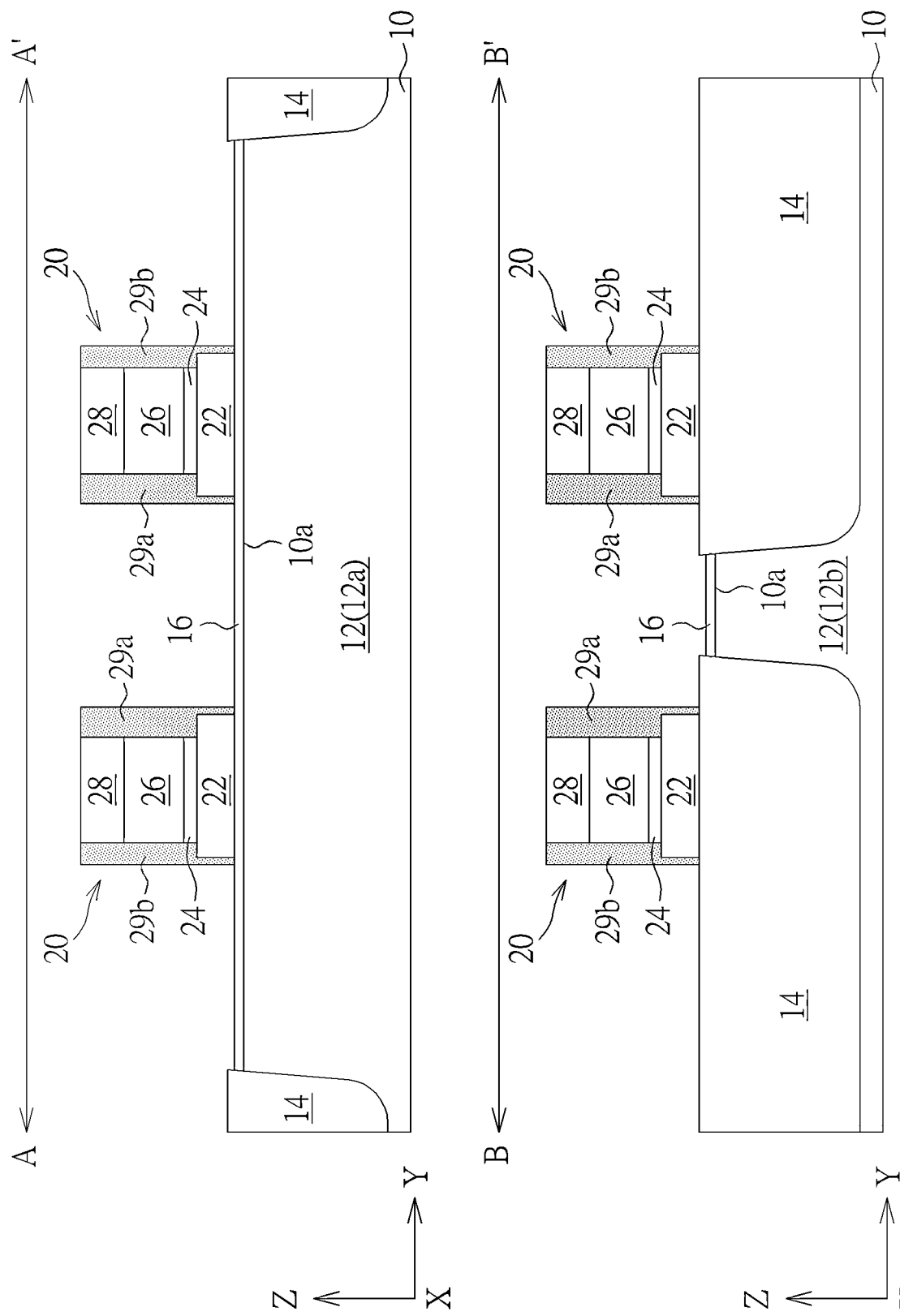

FIG. 2 illustrates cross-sectional views of the semiconductor memory device along line AA' and line BB' as shown in FIG. 1. Line AA' extends along the Y direction to cut through the stack structures 20 and one of the first portions 12a. Line BB' extends along the Y direction to cut through the stack structures 20 and one of the second portions 12b. As shown in FIG. 2, each of the stack structures 20 includes a floating gate 22 directly contacting the dielectric layer 16 and the trench isolation structure 14, a control gate 26 disposed on the floating gate 22, a hard mask 28 disposed on the control gate 26, and an insulating layer 24 disposed between the floating gate 22 and the control gate 26. The floating gate 22 and the control gate 26 may be made of polysilicon, but is not limited thereto. The hard mask layer 28 may be made of silicon nitride, but is not limited thereto. The insulating layer 24 may include an oxide layer, a nitride layer, or an oxide-nitride-oxide (ONO) composite layer, but is not limited thereto. A first spacer 29a is formed self-aligned on the inner sidewall of each of the stack structures 20 next to the second portions 12b, and a second spacer 29b is formed self-aligned on the outer sidewall of each of the stack structures 20 opposite to the first spacer 29a. The first spacer 29a and the second spacer 29b may respectively include an oxide layer, a nitride layer, or an oxide-nitride-oxide composite layer, but is not limited thereto. The floating gate 22, insulating layer 24, control gate 26, hard mask 28, first spacer 29a and second spacer 29b concurrently extend along the length of respective stack structures 20.

Figure 3:
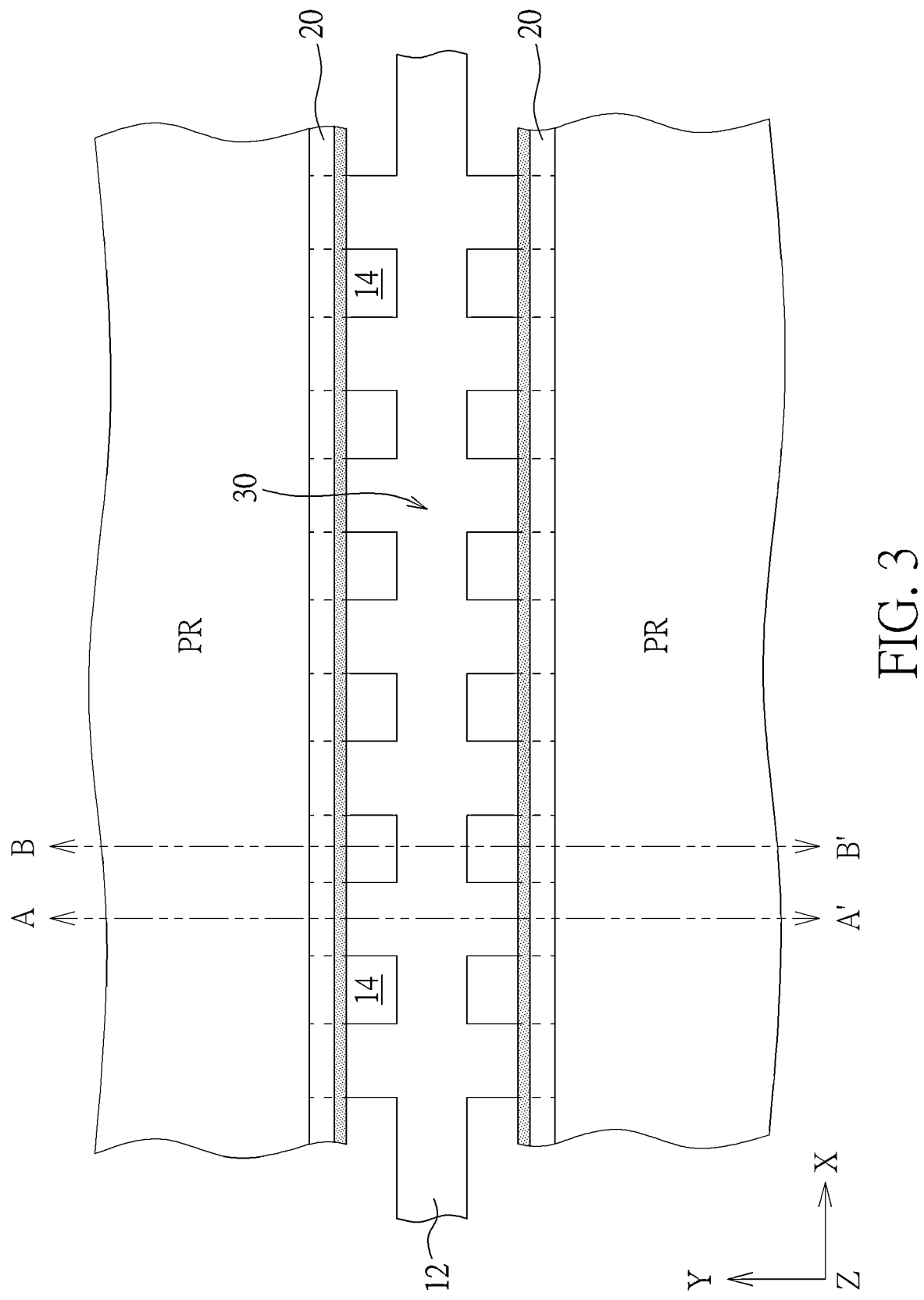
Figure 4:
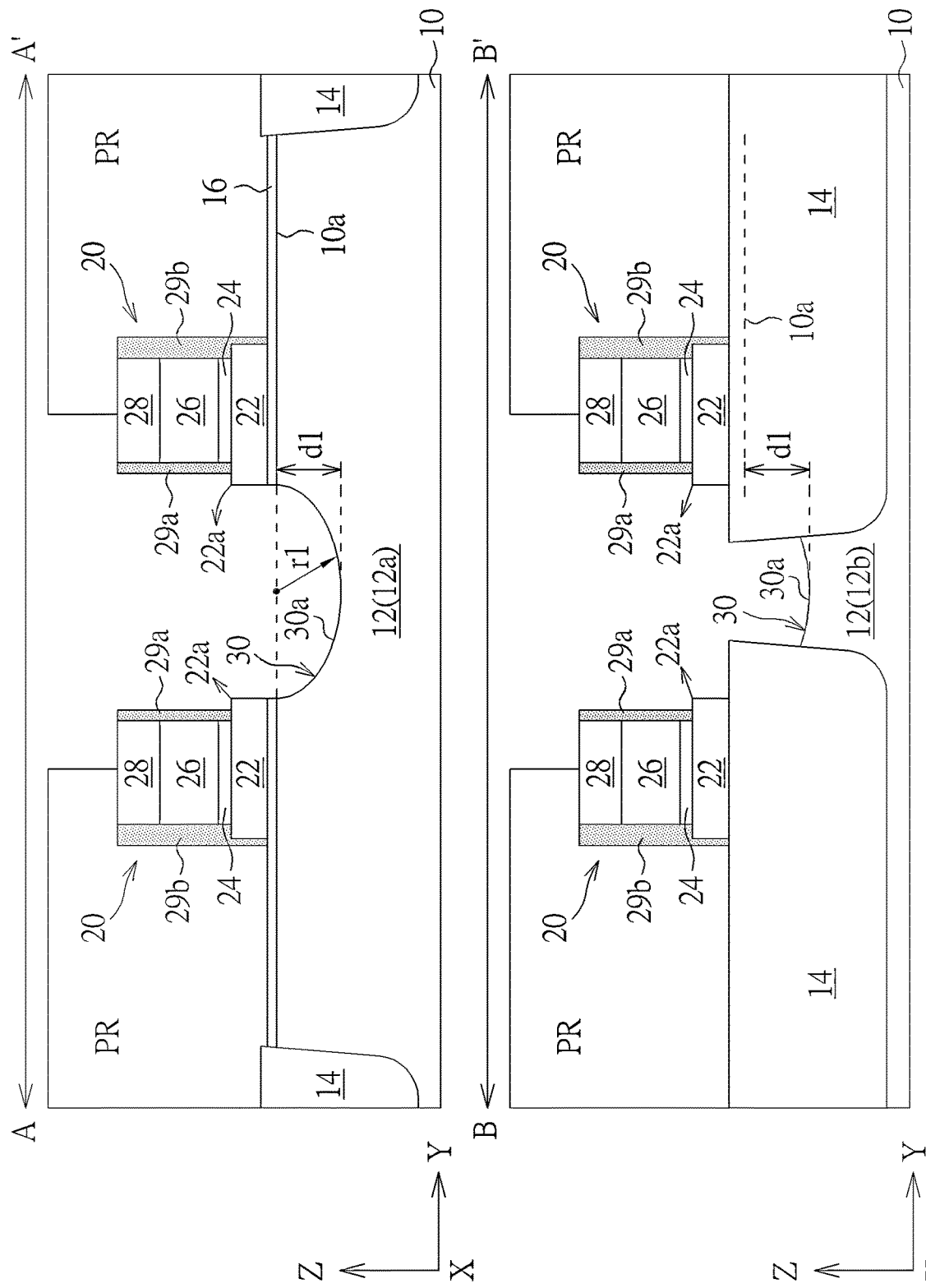

Please refer to FIG. 3 and FIG. 4. A mask layer PR is formed on the substrate 10 and patterned to form a trench opening between the stack structures 20 to partially expose the hard mask layer 28 and the first spacer 29a of each of the stack structures 20 and portions of the active region 12 (and the dielectric layer 16 thereon) and the trench isolation structure 14 between the stack structures 20. Following, using the mask layer PR and the stacked structures 20 as an etching mask, a dry etching process is performed to etch the exposed portions of the dielectric layer 16 and the active region 12, thereby forming a recessed region 30 in the substrate 10 between the stack structures 20. The profile of the upper surface 30a may be controlled by adjusting process parameters of the dry etching process. According to an embodiment of the present invention, in the cross-sectional view along line AA' as shown in the upper portion of FIG. 4, the upper surface 30a of the recessed region 30 may has a concave profile, and preferably with a radius r1 approximately between 40 nm and 60 nm, but is not limited thereto. According to an embodiment of the present invention, the depth of the recessed region 30 may be controlled to make the upper surface 30a nearly semicircular in the cross-sectional view along line AA'. According to an embodiment of the present invention, the upper surface 30a of the recessed region 30 is lower than the surface 10a of the substrate 10 by a depth d1 between 0 nm and 60 nm, but is not limited thereto. The first spacers 29a exposed from the mask layer PR may be etched during the dry etching process, exposing the upper corners 22a and inner sidewalls of the floating gates 22, which may be approximately aligned with the edge of the concave upper surface 30a of the recessed region 30 along the Z direction. In some embodiments, the dry etching process may have a high etching selectivity between the active region 12 and the trench isolation structure 14, so the trench isolation structure 14 between the stack structures 20 is barely etched, as shown in FIG. 4. In other embodiments, the dry etching process may etch and recess the trench isolation structure 14 between the stack structures 20 to a level between the upper surface 30a of the recessed region 30 and the surface 10a of the substrate 10.

Figure 5:
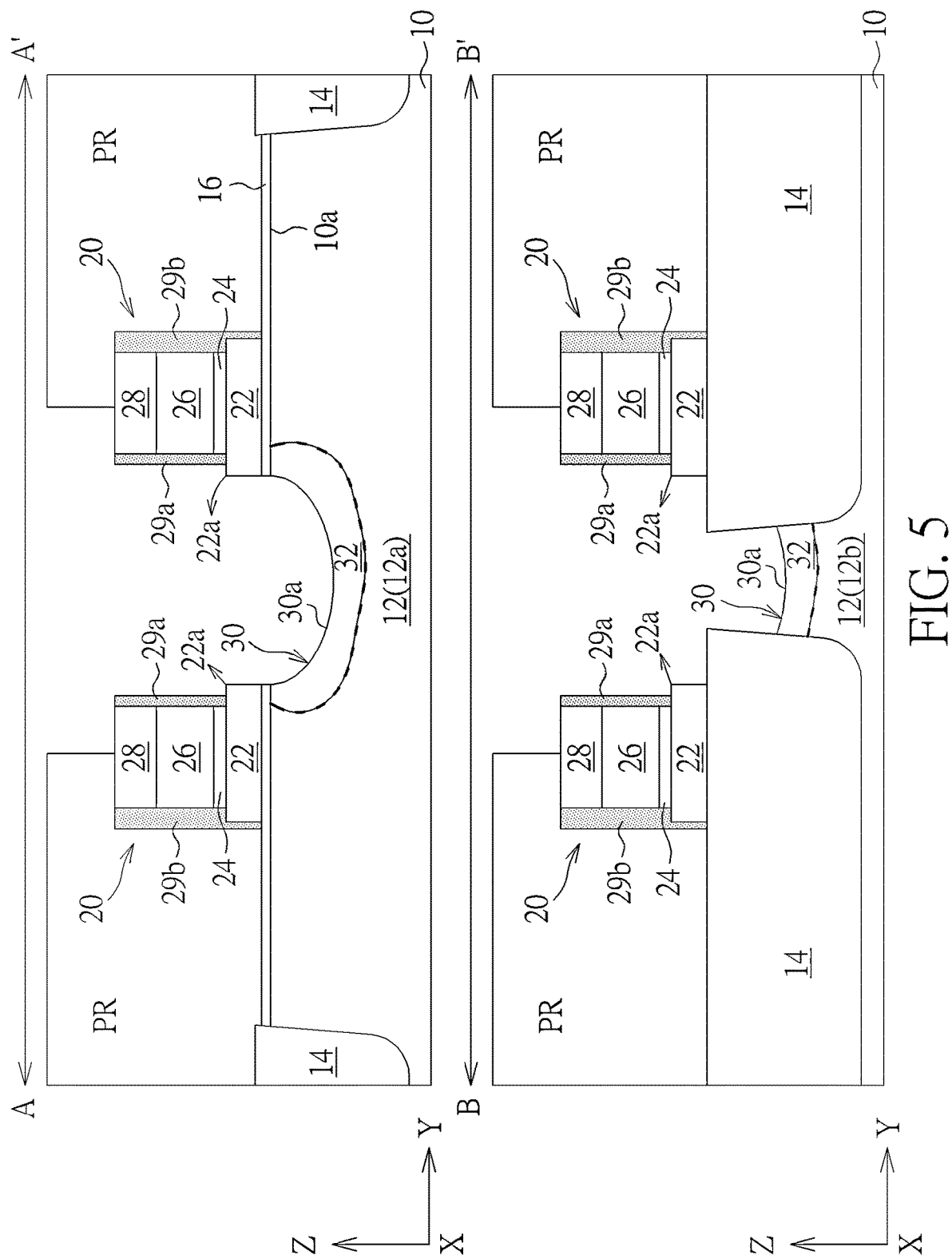

Please refer to FIG. 5. Subsequently, using the mask layer PR and the stacked structures 20 as an implanting mask, an implanting process is performed to form a source line doped region 32 in the recessed region 30 of the substrate 10. The upper surface 30a of the recessed region 30 is also the upper surface of the source line doped region 32. That is, the upper surface of the source line doped region 32 may be concave and has a radius (the radius r1 shown in FIG. 4) approximately between 40 nm and 60 nm, and may be nearly semicircular in some cases. The conductivity type of the source line doped region 32 is opposite to that of the substrate 10. According to an embodiment of the present invention, the source line doped region 32 is N-type.

Figure 6:
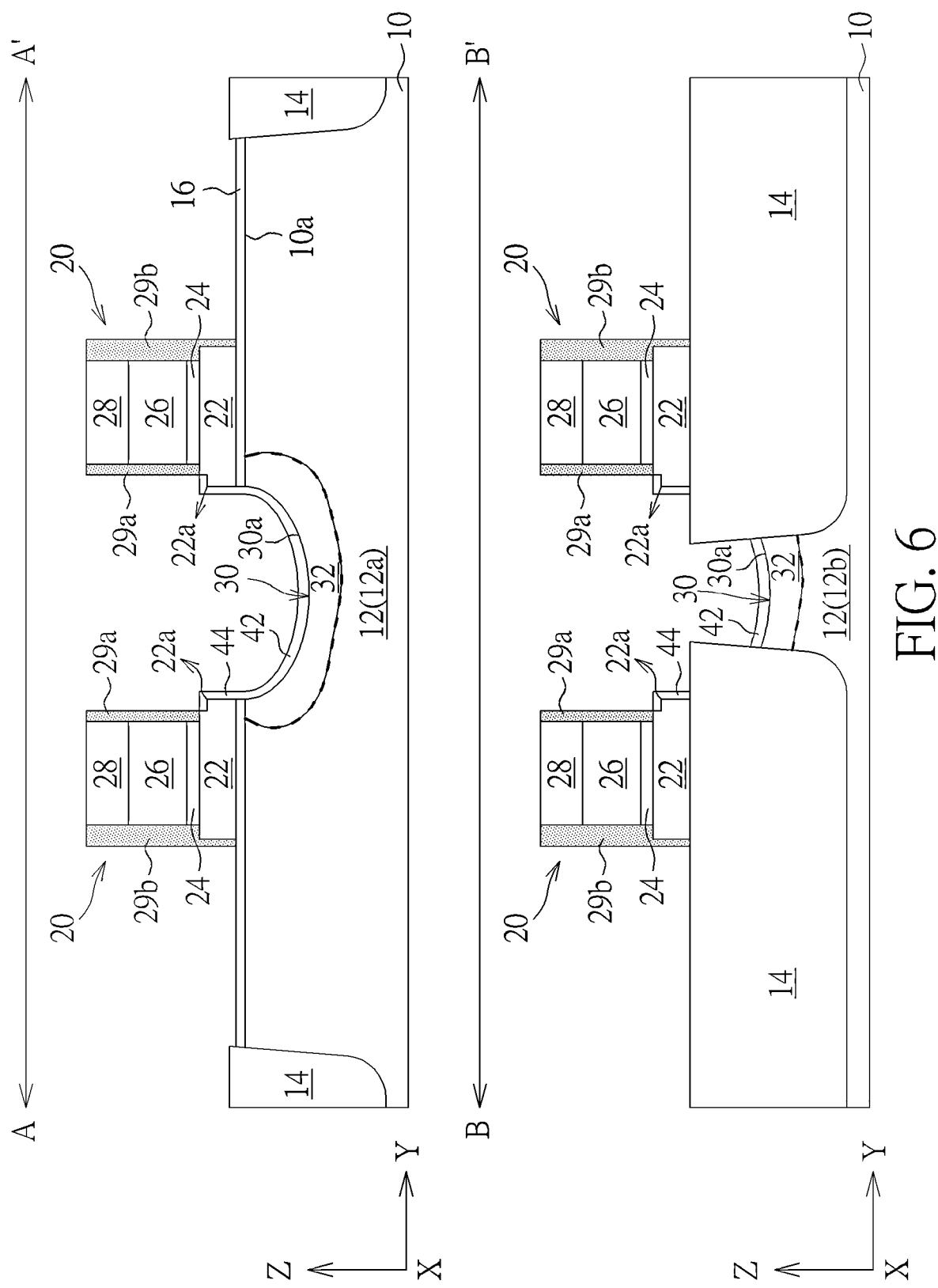

Please refer to FIG. 6. After forming the source line doped region 32, the mask layer PR is removed, and then an oxidation process is performed to grow an insulating layer 42 along the upper surface 30a of the recessed region 30 and a tunnel oxide layer 44 along the upper corners 22a and inner sidewalls of the floating gates 22. According to an embodiment of the present invention, the insulating layer 42 and the tunnel oxide layer 44 are silicon oxide layers. The thicknesses of the insulating layer 42 and the tunnel oxide layer 44 may be about 50 to 250 angstroms, but is not limited thereto. In some embodiments, the insulating layer 42 grown from the implanted upper surface 30a may have a thickness larger than the thickness of the tunnel oxide layer 44 grown from the floating gates 22. According to an embodiment of the present invention, a clean process such as a wet clean process may be performed to remove particles, spacer residues or native oxides on the upper surface 30a of the recessed region 30 and the floating gates 22 to improve film qualities of the insulating layer 42 and the tunnel oxide layer 44.

Please refer to FIG. 7, FIG. 8, FIG. 9, and FIG. 10. Subsequently, a semiconductor layer (not shown) such as a polysilicon layer is formed on the substrate 10 in a blanket manner and covers the stack structures 20. An etching back process, for example, an anisotropic dry etching process is then performed to etch back the semiconductor layer until the dielectric layer 16 is exposed, thereby forming an erase gate 50 between the stack structures 20 and two word lines 60 adjacent to the sides of the stack structures 20 opposite to the erase gate 50. The erase gate 50 has a T shaped cross-sectional profile, overlapping the upper corners 22a of the floating gate 22 and the upper corners 14a of the trench isolation structure 14 between the stack structures 20. The erase gate 50 is electrically isolated from the source line doped region 32 by the insulating layer 42, and is electrically isolated from the floating gates 22 and the control gates 26 by the tunnel oxide layers 44 and the first spacers 29a. The bottom surface of the erase gate 50 is conformal to the concave upper surface 30a of the recessed region 30 and lower than the surface 10a of the substrate 10. The word lines 60 are electrically isolated from the floating gates 22 and the control gates 26 by the second spacers 29b. The first spacer 29a and the second spacer 29b on two sides of each of the stack structure 20 are asymmetry and have different thicknesses. According to an embodiment of the present, the thickness of the first spacer 29a on the sidewall of the control gate 26 is smaller than the thickness of the second spacer 29b on the opposite sidewall of the control gate 26.

Following, an implanting process is performed to form bit line doped regions 52 in the substrate 10 adjacent to the outer edges of the word lines 60 opposite to the source line doped region 32. The bit line doped region 52 and the source line doped region 32 have the same conductivity type, such as N-type. Subsequently, an etching stop layer 72 and an interlayer dielectric layer 74 are formed on the substrate 10, and contact plugs through the interlayer dielectric layer 74 and the etching stop layer 72 are formed to electrically connect to the floating gates 22, the control gates 26, the erase gate 50, the word lines 60, the source line doped region 32, and the bit line doped regions 52, respectively. To simplified the drawings, only bit line contacts 76 disposed on the bit line doped regions 52 and a source line contact 77 disposed on the source line doped region 32 are shown in the drawings. The etching stop layer 72 and the interlayer dielectric layer 74 are made of dielectric materials, such as silicon oxide or silicon nitride, but are not limited thereto. The bit line contacts 76 and the source line contact 77 may include conductive materials such as titanium (Ti), titanium nitride (TiN), tantalum (Ta), tantalum nitride (TaN), tungsten (W), aluminum (Al), copper (Cu), polysilicon, silicide, or a combination thereof, but is not limited thereto.

Figure 7:
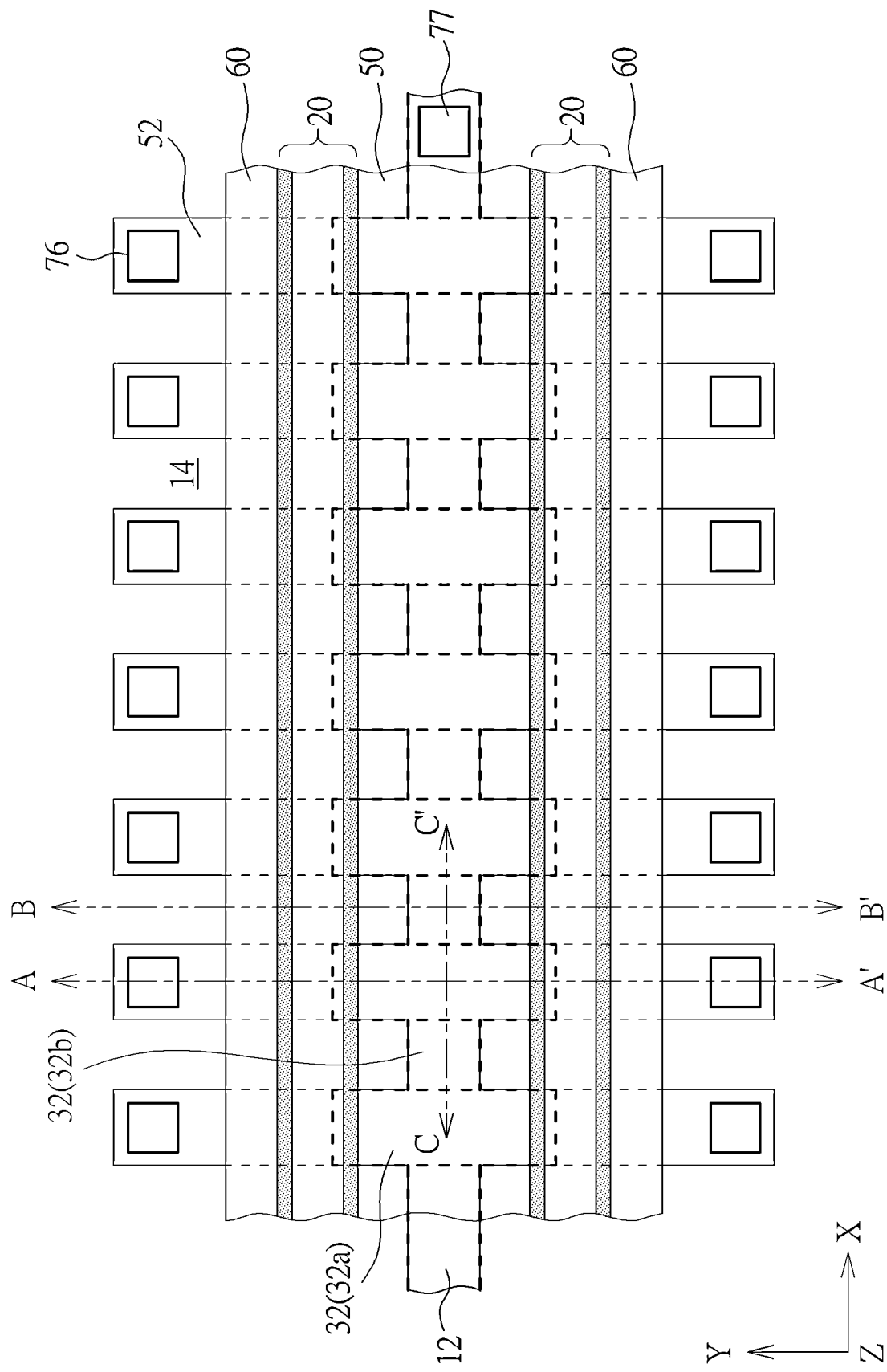
Figure 8:
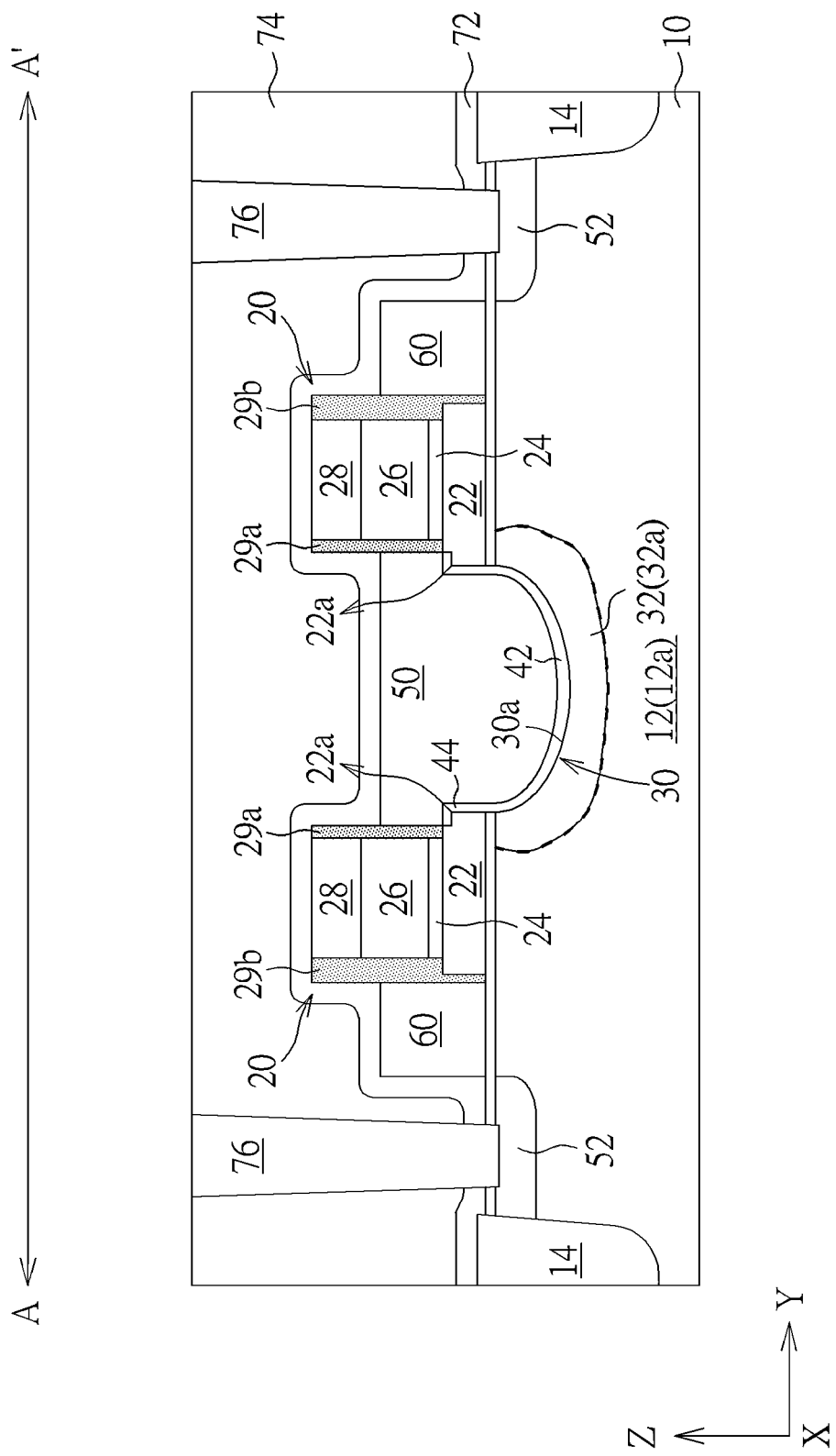
Figure 9:
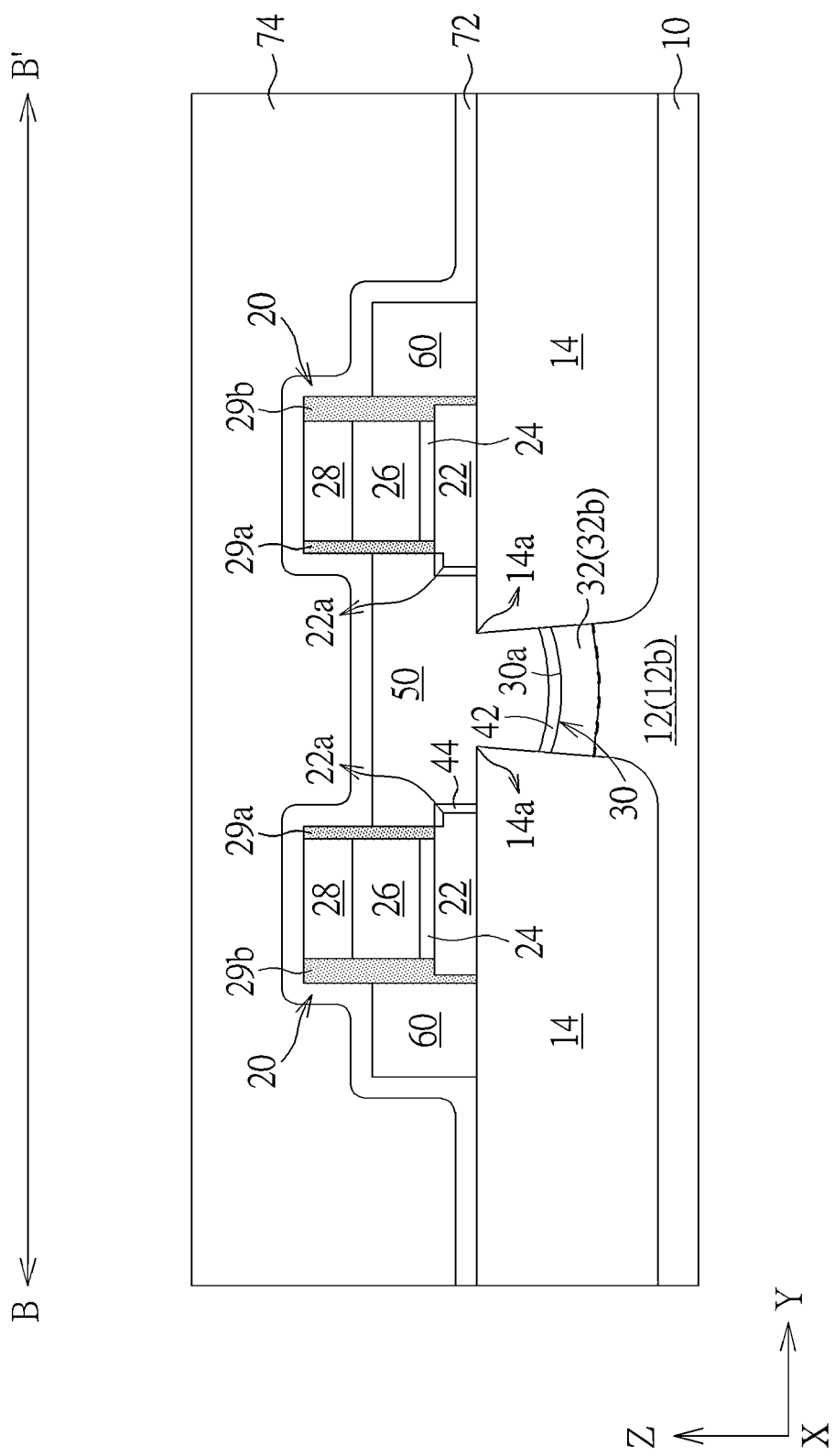
Figure 10:
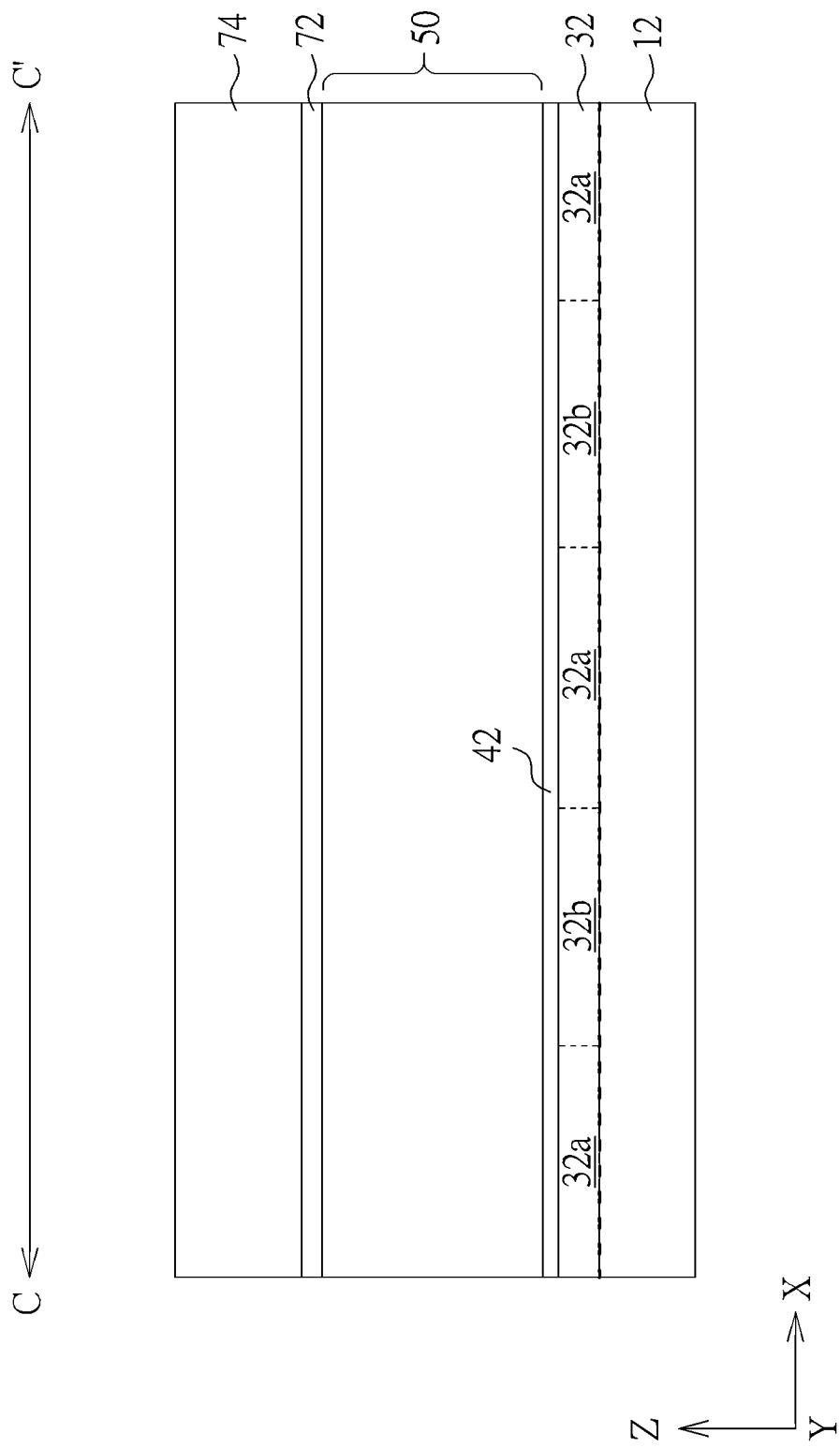

By performing the manufacturing process illustrated above, the semiconductor memory device of the present invention is obtained. As shown in FIG. 7, the stack structures 20 (including the floating gates 22 and the control gates 26), the erase gate 50 and word lines 60 of the semiconductor memory device extend in parallel along the X direction to cross the fish-bone shaped active region 12. The source line doped region 32 is between the stack structures 20 and has a fish-bone shape as the active region 12, including a plurality of first portions 32a (corresponding to the first portions 12a of the active region 12) and second portions 32b (corresponding to the second portions 12b of the active region 12). The second portions 32b are connected between the first portions 32a to form a continuous current path. As shown in FIG. 8, each first portion 32a may have an approximately ring-sector shape with a width larger than the space between the floating gates 22, and is partially overlapped by the floating gates 22. As shown in FIG. 9, the second portions 32b may also have an approximately ring-sector shape, but with a width smaller than the space between the floating gates 22 and not overlapped by the floating gates 22. In some embodiments, as shown in FIG. 10, which is a cross-sectional view along the line CC' cutting through the middle portion of the source line doped region 32 along the X direction, the first portions 32a and the second portions 32b may have top and bottom surfaces flush with each other, so that a smooth current path in the middle portion of the source line doped region 32 may be provided. The bit line doped regions 52 are formed in the end portions of the fish-bone shaped active region 12 adjacent to the outer edges the word lines 60. The overlapping regions of the stack structures 20 and the active region 12 are memory cells of the semiconductor memory device, which are tied by the fish-bone shaped source line doped region 32 to the same ground voltage (applied through the source line contact 77). By performing the implanting process on the concave upper surface 30a of the recessed region 30, the source line doped region 32 of the semiconductor memory device provided by the present invention may have a ring-sector cross-sectional shape and an increased cross-sectional area, so that the resistance of the source line doped region 32 may be reduced, and the accuracy of sensing operations of the memory cells may be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
   an active region defined in a substrate by a trench isolation structure;
   a pair of floating gates on the substrate and at two sides of a fish-bone shaped recessed region of the active region;
   a source line doped region in the fish-bone shaped recessed region of the active region, wherein a bottom surface of the source line doped region extends above a bottom surface of the trench isolation structure;
   an erase gate disposed between the floating gates and on the source line doped region, wherein a lower portion of the erase gate extends below the surface of the substrate;
   an insulating layer disposed between the source line doped region and the erase gate;
   a tunnel oxide layer disposed between the erase gate and each of the floating gates and continuously covering a sidewall of a first upper corner and a top surface and a sidewall of a second upper corner of each of the floating gates;
   a word line disposed on the substrate and adjacent to a side of each of the floating gates opposite to the erase gate; and
   a bit line doped region in the substrate and adjacent to the word line.

2. The semiconductor memory device according to claim 1, wherein the bottom surface of the source line doped region is lower than a bottom surface of the bit line doped region.

3. The semiconductor memory device according to claim 1, wherein the source line doped region comprises a plurality of first portions and a plurality of second portions connected between the first portions, wherein the second portions are between sidewalls of the trench isolation structure.

4. The semiconductor memory device according to claim 3, wherein each of the first portions is partially overlapped by the floating gates and none of the second portions is overlapped by the floating gates.

5. The semiconductor memory device according to claim 3, wherein the bottom surfaces of the first portions are flush with bottom surfaces of the second portions.

6. The semiconductor memory device according to claim 1, wherein an upper surface of the source line doped region has a concave profile lower than a surface of the substrate.

7. The semiconductor memory device according to claim 6, wherein the concave profile has a radius between 40 nm and 60 nm in a cross-sectional view perpendicular to the floating gates.

8. The semiconductor memory device according to claim 6, wherein the upper surface of the source line doped region is lower than the surface of the substrate by a depth between 0 nm and 60 nm.

9. The semiconductor memory device according to claim 1, wherein the erase gate covers the second upper corner of each of the floating gates and upper corners of the trench isolation structure between the floating gates.

10. The semiconductor memory device according to claim 1, wherein the erase gate has a T shaped profile.

11. The semiconductor memory device according to claim 1, wherein the second upper corner of each of the floating gates is aligned with an edge of the upper surface of the source line doped region.

12. The semiconductor memory device according to claim 1, further comprising:
   a control gate disposed on each of the floating gates;
   a dielectric layer between the control gate and the floating gates;
   a first spacer between a sidewall of the control gate and the erase gate; and
   a second spacer between another sidewall of the control gate and the word line, wherein the first spacer and the second spacer comprise different thickness.

13. The semiconductor memory device according to claim 1, wherein the source line doped region and the bit line doped region have a same conductivity type that is opposite to a conductivity type of the substrate.

* * * * *